United States Patent
Di Prisco et al.

(10) Patent No.: US 6,186,063 B1
(45) Date of Patent: *Feb. 13, 2001

(54) SCREEN PRINTING MACHINE WITH IMPROVED DEVICE FOR ASPIRATING EXCESS INK

(75) Inventors: Aldo Di Prisco, Scarnafigi; Benedetto Mazzocchi, Bussero, both of (IT)

(73) Assignee: IANUA S.p.A., Este (IT)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/137,516

(22) Filed: Aug. 20, 1998

(30) Foreign Application Priority Data

Sep. 5, 1997 (IT) .............................. PD97A0191

(51) Int. Cl.[7] ..................................... B41L 13/18
(52) U.S. Cl. .......................... 101/123; 101/114; 101/124
(58) Field of Search ................................. 101/123, 124, 101/129, 114

(56) References Cited

U.S. PATENT DOCUMENTS

| | | | |
|---|---|---|---|
| 4,433,623 | * | 2/1984 | Beckim ................................. 101/123 |
| 4,586,433 | * | 5/1986 | Jaffa et al. ........................... 101/123 |
| 4,998,470 | * | 3/1991 | Klemm ................................. 101/115 |
| 5,050,497 | * | 9/1991 | Klemm ................................. 101/124 |
| 5,070,782 | * | 12/1991 | Sakai et al. ......................... 101/123 |
| 5,203,061 | * | 4/1993 | Hamada .............................. 29/33 M |
| 5,273,780 | * | 12/1993 | Borger et al. ..................... 101/123 X |
| 5,713,277 | * | 2/1998 | Szarka ................................. 101/123 |

FOREIGN PATENT DOCUMENTS

| | | |
|---|---|---|
| 511 883 | 11/1992 | (EP) . |
| 0642 923 | 3/1995 | (EP) . |
| 2517 254 | 6/1983 | (FR) . |

OTHER PUBLICATIONS

Patent Abstract of Japan vol. 017, No. 565 (M–1495) Oct. 13, 1993 & JP 05 162284 A (Sony Corp), Jun. 29, 1993 *abstract*.

* cited by examiner

*Primary Examiner*—John S. Hilten
*Assistant Examiner*—Minh H. Chau
(74) *Attorney, Agent, or Firm*—Guido Modiano; Albert Josif; Daniel O'Byrne

(57) ABSTRACT

A screen printing machine with an improved device for aspirating excess ink, comprising a printing bed for supporting a glass plate to be printed, which is provided in an upward region with a frame with a mesh surface forming a permeable portion. Ink is placed on the frame. The machine has a doctor unit comprising a doctor and a complementary doctor whose dimensions are equal to the width of the frame and which are adapted to move along the frame from one end to the other in order to respectively distribute and collect the ink. The machine further comprises a suction unit provided with a suction nozzle and means for guiding the nozzle along a preset path. The suction nozzle moves on the mesh surface so as to follow the path traced by the perimetric edge of the glass plate in order to aspirate the excess ink.

13 Claims, 3 Drawing Sheets

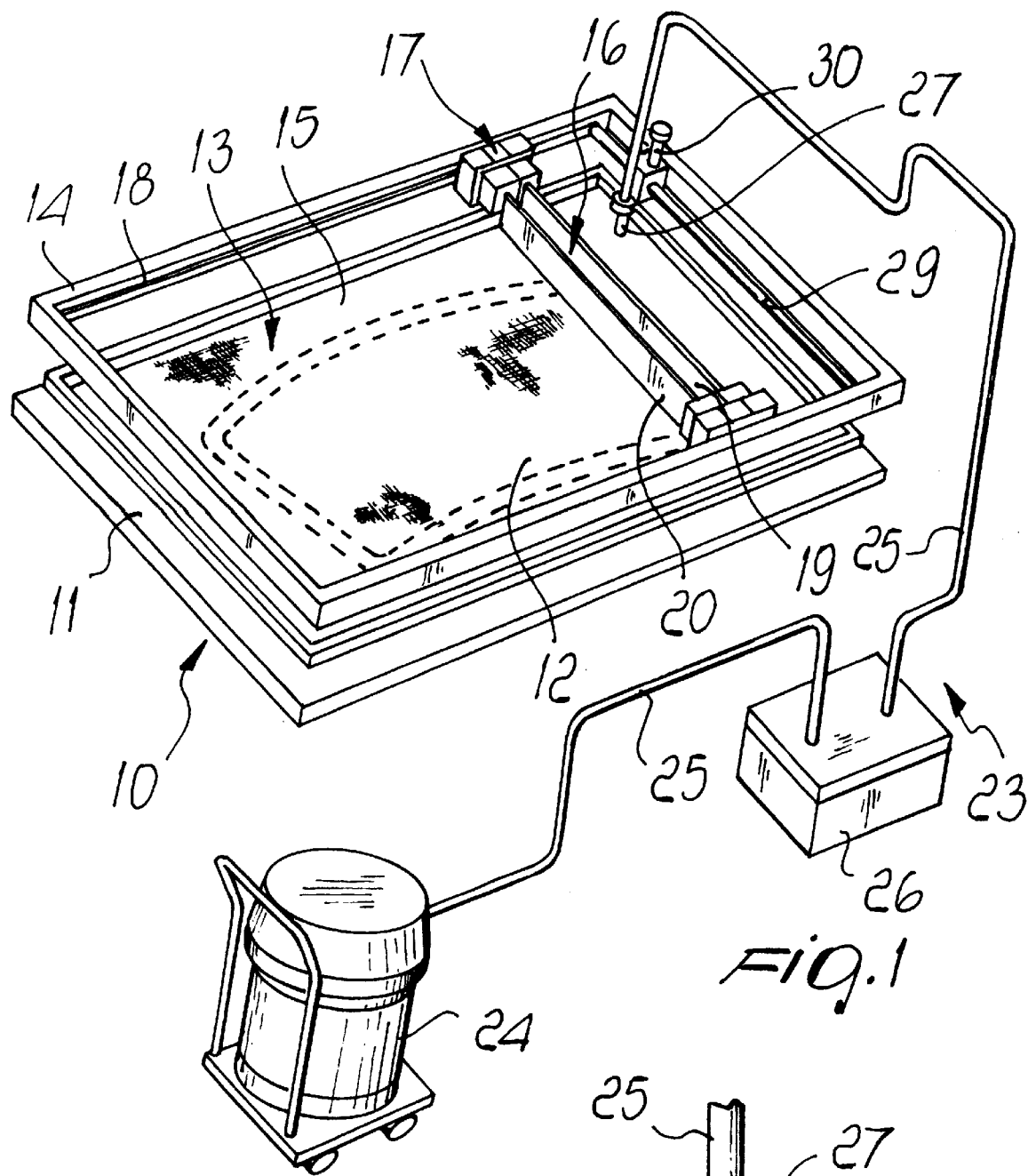
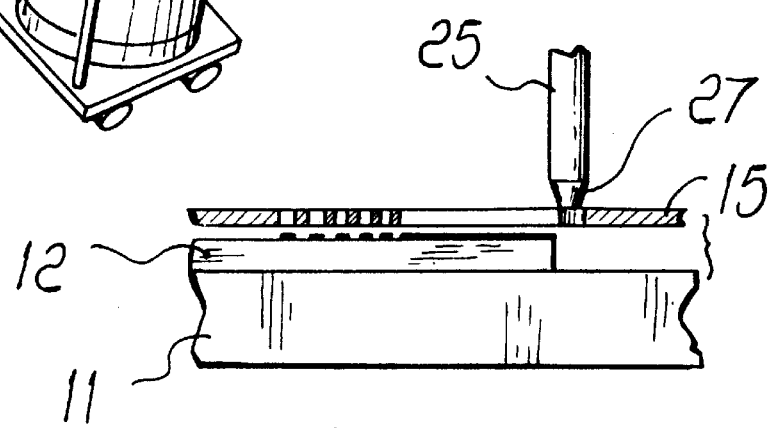

SCREEN PRINTING MACHINE WITH IMPROVED DEVICE FOR ASPIRATING EXCESS INK

BACKGROUND OF THE INVENTION

The present invention relates to a screen printing machine with an improved device for aspirating excess ink.

The screen-printing method is currently widely used to reproduce by application of a printing medium, generically called ink, patterns as images, words, drawings or figures and the like on sheet material such as paper, glass plates, plastic backings or fabrics etcetera.

In particular, this printing method, when used to apply images to glass plates, uses a mesh frame which is arranged above a fixed supporting surface and whereon minute through openings are formed, which, as a whole, form the image to be printed.

The mesh frame is spread with ink (which can be black or colored); the ink can pass only through the openings, thus reaching the item to be printed and fixing thereon so as to form the image.

This printing method is usually used mainly on windshields and on rear and side windows of motor vehicles.

All these components must in fact be screen-printed with borders at their perimetric edges.

The borders are aesthetically indispensable because they conceal the region where each component is assembled in its respective seat.

Currently it is in fact customary to assemble, for example, windshields by arranging them in the complementarily shaped seat of the structure of the vehicle by means of adhesives, without having to first insert therein special weather stripping inside which the seat for the windshield used to be formed.

Currently, therefore, the border of the windshield and of all the other glass parts must conceal the underlying coupling region and accordingly must be printed with maximum precision and accuracy.

Unfortunately, screen-printing machines are unable to work according to the printing process known in the field as "edge to edge" without producing excess ink on the edge of the glass plate.

This excess produces deposits (ink drops) which are not allowed on the edge of the windshield because they dirty the glass.

Machines are currently available which have a mechanical ink scraping device that acts on the mesh frame from below.

This device, however, after a certain number of production cycles, inevitably produces an application of ink on the printing region which causes smudges and shadows.

Other screen-printing machines are commercially available which have scraping devices which operate in combination with pads, for example rolls of paper, by means of which an attempt is made to delete shadows and smudges without however achieving their full elimination.

Finally, there are present machines which are provided with an aspirator with a suction nozzle which acts on the upper part of the mesh frame, i.e., on the part on which the ink is spread.

The aspirator is capable of aspirating ink and any residues thereof on all of the exposed region of the frame by means of the suction nozzle, whose dimensions are at least equal to the width of the frame and which is actuated by a mechanical device which makes it shift along all of the frame.

This last machine, however, is unable to perfectly aspirate only the excess ink on the edge; most of all, it produces uneven image definition on the glass plate.

These machines are in fact designed and built to work in a continuous cycle and to print one glass plate after the other.

The aspirator instead aspirates ink on the frame and in a short time dries the ink between the openings of the frame, making it difficult for new ink to pass through to print a subsequent glass plate.

Accordingly, constant cleaning of the frame is necessary to clear the openings formed in the frame from the clogging produced by the dried ink.

SUMMARY OF THE INVENTION

The aim of the present invention is to provide a screen printing machine which eliminates the above-mentioned conventional drawbacks.

Within the scope of this aim, an object of the present invention is to provide a screen printing machine which allows to print images onto a glass plate up to the edge without smudges and most of all without leaking excess ink.

Another object of the present invention is to provide a screen printing machine which has a simple constructive structure.

Another object of the present invention is to provide a machine which operates according to an effective and practical process.

Another object of the present invention is to provide a screen printing machine which can work without requiring the intervention of specialized personnel.

Another object of the present invention is to provide a screen printing machine which requires neither particular maintenance nor frequent cleaning of the frame.

Another object of the present invention is to provide a screen printing machine which can produce prints having excellent ink uniformity characteristics.

This aim, these objects and others which will become apparent hereinafter are achieved by a screen printing machine comprising a printing table for supporting a glass plate to be printed which is provided in an upward region with a frame with a mesh surface, which forms a permeable portion and above which ink can be placed, and a doctor unit which comprises a doctor and a complementary doctor whose dimensions are equal to the width of said frame and which are suitable to move along said frame from one end to the other in order to respectively distribute and collect said ink, characterized in that it comprises a suction unit provided with a suction nozzle and means for guiding said nozzle along a preset path, said nozzle moving on said frame so as to follow said path which is traced by a perimetric edge of said glass plate, in order to aspirate excess ink.

BRIEF DESCRIPTION OF THE DRAWINGS

Further characteristics and advantages of the present invention will become apparent from the following detailed description of a preferred embodiment thereof, illustrated only by way of non-limitative example in the accompanying drawings, wherein:

FIG. 1 is a perspective view of a screen printing machine with a suction unit according to the present invention;

FIG. 2 is a side view of a detail of a screen printing machine with a suction unit according to the invention;

DESCRIPTION OF THE PREFERRED EMBODIMENTS

Figure 3:
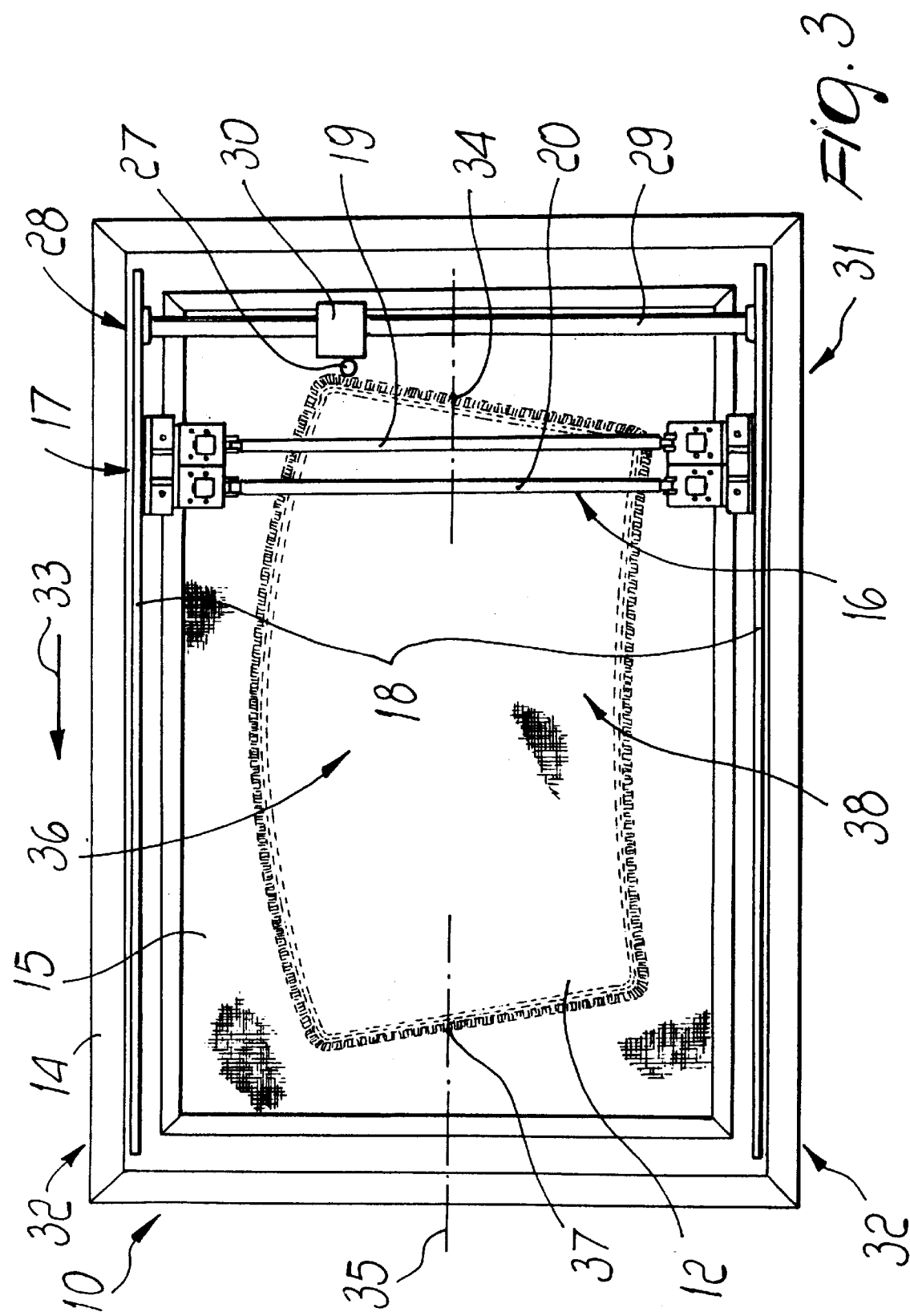
FIG. 3 is a top view of a screen printing machine with a suction unit according to the invention.
Figure 4:
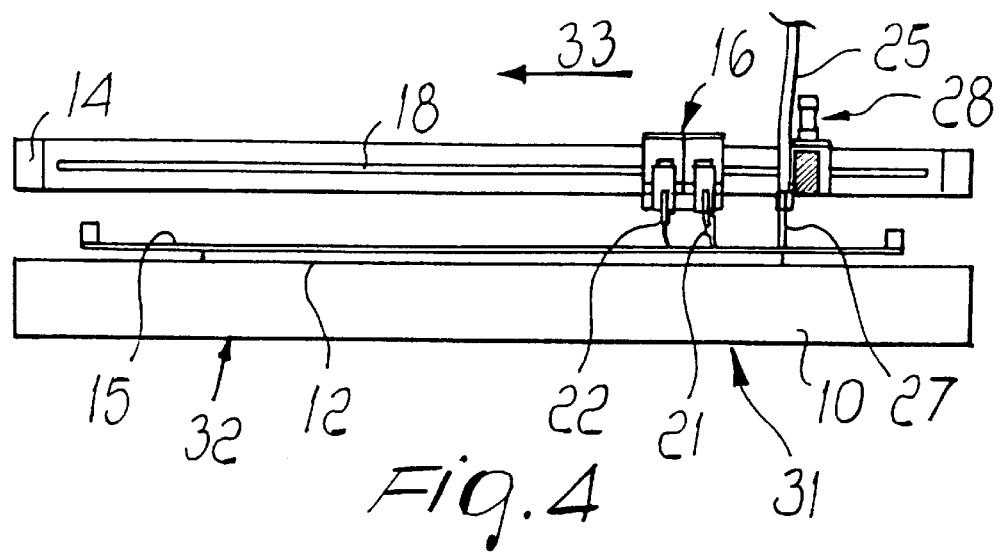
FIGS. 4, 5 and 6 are side views of the screen printing machine with a suction unit according to the invention in three successive steps of its operation.
Figure 5:
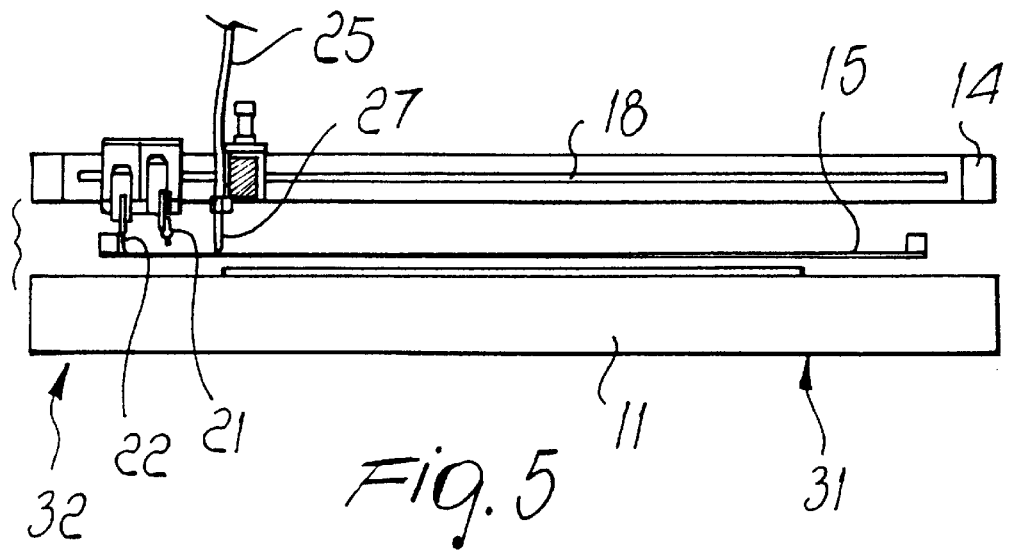
Figure 6:
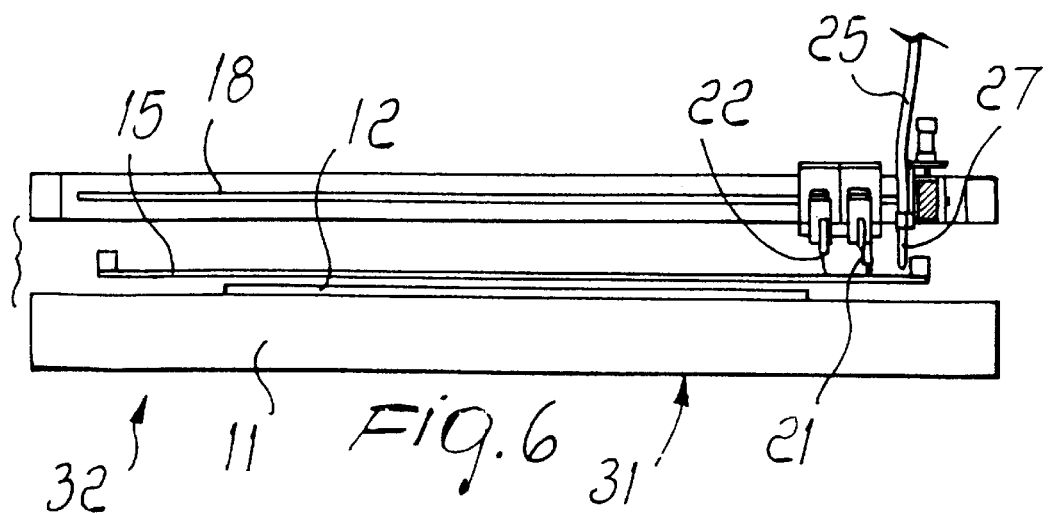

With reference to the above figures, a screen printing machine according to the invention is generally designated by the reference numeral 10 and comprises a printing bed 11 above which a glass plate 12 to be screen printed is arranged.

A frame 13 is superimposed on the printing bed 11 and is supported by a border 14 which provides the supporting structure for a mesh surface 15.

The mesh surface 15 forms a printing image by means of an ink-permeable portion which in this case is formed at its perimetric edge.

The border 14 is meant to support a doctor unit 16 constituted by a first framework 17 which can slide longitudinally along the entire frame 13 from one end to the opposite end and viceversa.

The doctor unit 16 is actuated, in a per se known manner, by a first drive (not shown in the above figures) along a track 18 formed on the border 14 of the frame 13.

The first framework 17 is constituted by a first bridge 19 and by a second bridge 20 which is parallel to the first one. These bridges respectively support a doctor 21 and a complementary doctor 22 of the per se known type which are adapted to respectively distribute and collect the ink on the mesh surface 15 of the frame 13.

The machine 10 further comprises, in particular, a suction unit 23 which is constituted by an aspirator 24 which is connected, by means of a flexible hose 25, to an ink collection tank 26 and is provided with suction means, in particular with a suction nozzle 27 through which it draws ink in order to convey it into the collection tank 26.

It will be noted, with reference to the FIGS. 1–6, and in particular to FIG. 2, that the suction means 27 has such a configuration, i.e. shape and cross-sectional dimensions, so as to be adapted to aspirate excess ink, while following in movement the perimetric edge of the sheet material 12, from a limited ink permeable portion of the mesh surface 15. Such limited portion is located above the perimetric edge of the sheet material 12 and corresponds, as seen in FIGS. 1 and 3, to the profile of the image printed on the sheet material.

The suction unit 23 is supported by a second framework 28 which is operated automatically by a second drive, not shown in the figures, which is fully independent of said first drive and is suitable to make the second framework 28 also move along the track 18.

The first 27 and second 28 frameworks constitute a framework structure which is each independently actuatable, in a known manner, by way of any suitable actuation means such as chain, rack or screw actuations, linear motors or other state-of the art adapted electrical, pneumatic or hydraulic drives.

The second framework 28, in particular, comprises a bridge 29, along which a slider 30 can slide, and is parallel to the first framework 17.

The second framework 28 constitutes the supporting skeleton for the duct 25 of the suction unit 23. In particular, the suction nozzle 27, which is fixed to the slider 30 which can slide along the bridge 29, is arranged at right angles to the printing bed 11 and can be arranged itself in contact with the mesh surface 15, with a lifting and lowering movement, at the perimetric edge of the glass plate 12.

In this manner, the suction nozzle 27 can, when lowered, aspirate the excess ink from the mesh surface 15; otherwise said excess ink, by passing through the permeable portion of the mesh surface 15, would reach the glass plate 12 and would drip along its edge so as to form deposits constituted by one or more drops.

The doctor unit 16 is actuated automatically and fully independently of the suction unit 23.

The screen printing process that can be performed with a machine 10 according to the invention consists first of all in arranging the glass plate 12 on the printing bed 11 and in centering its position with respect to the print image formed by the permeable portion of the mesh surface 15 of the frame 13.

In order to perfectly print the glass plate 12 to its edge, since the edge is rounded, the print image formed on the mesh surface 15 by the ink-permeable portion is larger than the dimensions of the glass plate 12 and accordingly the frame 13 and the plate 12 must be conveniently centered with respect to each other.

The doctor unit 16 is then arranged at a first end 31 of the frame 13, so that the suction unit 23 is arranged between the doctor unit 16 and the border 14 of said first end 31.

The operating process continues with the application of ink above the mesh surface 15; this is usually performed manually by an operator.

Immediately thereafter, the doctor unit 16 actuates the doctor 21 so that the doctor moves down until it makes contact with the mesh surface 15; at the same time, the doctor unit 16 moves parallel to the printing bed 11, moving along the track 18 from the first end 31 to the second end 32 of the frame 13, in the direction indicated by the arrow 33.

While the doctor 21 distributes the ink so that by passing through the mesh surface 15 only in the permeable region it prints the intended image on the glass plate 12, the suction unit 23 moves starting from the point 34, which is on the longitudinal centerline 35 of the frame 12, and moves, while the suction nozzle 27 is conveniently lowered, along the curve that corresponds to the perimetric edge of a first half 36 of said glass plate 12 with respect to the centerline 35, so as to aspirate only the excess ink which would otherwise produce deposits.

Accordingly, when the doctor 21, in its right-to-left motion in the direction of the arrow 33, has reached the second end 32 of the frame 13, the suction nozzle 27 has correspondingly reached the point 37 of said second end 32 on the centerline 35.

The suction nozzle 27 is capable of accurately following, on the mesh surface 15, the path that corresponds to the edge of the glass plate 12 by means of its combined movement along the two perpendicular axes and up and down, ensured by the slider 30, which is slideable on the bridge 29, and by the movement of said bridge 29 along the track 18. Thus the perimetric edge of the sheet material to be printed, in the instant case of the glass sheet or plate 12, and the track 18 act as guiding means for guiding the movement of the suction nozzle means 27 along the aspiration path, which is therefore selectable and can be set according to the peripheral shape of the sheet material to be processed.

Once this operating step has been reached, the doctor 21 moves upward while the complementary doctor 22 moves downward until contact with the mesh surface 15 is achieved.

Then the doctor unit 16 and the suction unit 23 start to move and while the suction unit, preceding the doctor unit in its left-to-right translatory motion, moves along the profile that corresponds to the edge of the second half 38 of the glass plate 12, so as to aspirate the excess ink from the mesh surface 15, the complementary doctor 22 collects all the ink.

At this point, the complementary doctor 22 moves upward, the printed glass plate 12 can be replaced in the printing bed 11 with a new glass plate to be printed, and the machine 10, which has returned to the initial position, is ready to screen-print the new glass plate 12.

No downtimes are present with the above-described process and the doctor unit 16 and the suction unit 23 work independently but are mutually synchronized.

The machine 10 according to the invention is particularly suitable for continuous screen printing processes.

In practice, it has been observed that the present invention fully achieves the aim and all the intended objects.

An important advantage is achieved with the present invention in that a screen printing machine has been provided which allows to produce screen printing on glass up to the edge without imperfections and smudges and without forming deposits of excess ink.

Another important advantage of the present invention is that a screen printing machine has been provided which has a simple structure and ensures effective and practical operation.

Another advantage of the present invention is that the machine requires neither specialized personnel for its use nor any particular labor.

Another advantage is achieved with the present invention in that a screen printing machine has been provided which requires no frame cleaning operations.

Another advantage is achieved with the present invention in that a screen printing machine has been provided which achieves excellent printing uniformity.

Another important advantage is ensured with the present invention in that a screen printing machine has been achieved which produces images printed with edges which are outlined with extreme precision and accuracy.

The present invention is susceptible of numerous modifications and variations, all of which are within the scope of the same inventive concept.

All the details may also be replaced with other technically equivalent elements.

The materials employed, as well as the dimensions, may be any according to requirements.

What is claimed is:

1. A screen printing machine for printing a pattern within a perimetric edge of a sheet material, the printing machine comprising:
    a printing bed for supporting the sheet material to be printed;
    a frame located in an upward region of said printing bed;
    a mesh surface having an ink permeable portion over which printing ink is applicable for forming said printing pattern, said mesh surface being supported on said frame;
    a first framework movable along said frame;
    a doctor unit supported on said first framework for moving therewith, said doctor unit including a doctor and a complementary doctor for distributing over and, respectively, collecting from said mesh surface the printing ink;
    a second framework movable along said frame independently from said first framework; and
    a suction unit including suction means for aspirating excess printing ink, said suction means being movably mounted on said second movable framework so as to perform a combined movement over said mesh surface, along at least two perpendicular axes, whereby to follow a selectable aspiration path, and wherein said path is selectable so as to correspond to the perimetric edge of the sheet material, said suction means moving independently from and in synchronism with said doctor, along a first part of said aspiration path, and with said complementary doctor, along a second part of said aspiration path, and being configurated so as to aspirate excess ink from a limited ink permeable portion of said mesh surface located, along said path, above the perimetric edge of the sheet material.

2. The screen printing machine of claim 1, wherein said suction unit comprises an aspirator, a collection tank, and a flexible hose for connecting said suction unit to said aspirator, and wherein said suction means is constituted by a suction nozzle.

3. The screen printing machine of claim 1, comprising on said frame a guiding track, said first and second frameworks being independently actuatable to move each along said track.

4. The screen printing machine of claim 3, wherein said first framework is constituted by a first bridge for supporting said doctor and by a second bridge for supporting said complementary doctor, said second bridge being parallel to the first bridge.

5. The screen printing machine of claim 3, wherein said second framework has a bridge-like configuration and comprises a slider which is slidingly movable thereon, said suction means being supported on said slider for horizontal movement along said two perpendicular axes and for further movement along a third vertical axis, between a lifted position, away from said mesh surface, and a lowered position, in contact with said mesh surface.

6. In a screen printing machine for printing a pattern within a perimetric edge of a sheet material having:
    a printing bed for supporting the sheet material to be printed;
    a frame located in an upward region of said printing bed;
    a mesh surface having an ink permeable portion over which printing ink is applicable for forming said printing pattern, said mesh surface being supported on said frame;
    a framework structure being movably supported on said frame for moving over said mesh surface;
    an ink distribution and removal arrangement comprising:
        a doctor unit, including a doctor and a complementary doctor mounted on said framework structure for distributing over and, respectively, collecting from said mesh surface the printing ink; and
        a suction unit including suction means for aspirating excess printing ink mounted on said movable framework structure so as to perform, independently from said doctor unit, a combined guided movement over said ink permeable portion of said mesh surface along at least two perpendicular horizontal axes whereby to follow said aspiration path, the movement of said suction means being performed in synchronism with said doctor, along a first part of said aspiration path, and with said complementary doctor, along a second part of said aspiration path, and wherein said suction means have such a shape and cross-sectional dimensions so as to aspirate excess printing ink from a limited area of the ink permeable portion of said mesh surface located along the perimetric edge of the sheet material, said aspiration path having a profile set by the movement of the suction means guided along the perimetric edge of said sheet material and covering said ink permeable portion limited area.

7. The arrangement of claim 6, wherein said suction unit comprises an aspirator, a collection tank, and a flexible hose for connecting said suction unit to said aspirator, and wherein said suction means is constituted by a suction nozzle connected to said collection tank.

8. A screen printing machine for printing a pattern within a perimetric edge of a sheet material, the printing machine comprising:
- a printing bed for supporting the sheet material to be printed;
- a frame located in an upward region of said printing bed;
- a mesh surface having an ink permeable portion over which printing ink is applicable for forming said printing pattern, said mesh surface being supported on said frame;
- a framework structure being movably supported on said frame for performing a guided movement over said mesh surface;
- a doctor unit, including a doctor and a complementary doctor mounted on said framework structure for distributing over and, respectively, collecting from said mesh surface the printing ink;
- a suction unit including suction means for aspirating excess printing ink mounted on said movable framework structure so as to perform, independently from said doctor unit, a combined guided movement over said mesh surface along at least two perpendicular horizontal axes, whereby to follow a selectable aspiration path, said suction means, having such a shape and cross-sectional dimensions so as to aspirate excess printing ink from a limited area of the ink permeable portion of said mesh surface located along the perimetric edge of the sheet material; and
- movement guiding means for guiding the movement of said framework structure with respect to said frame and, respectively, the combined movement of said suction means along said selectable aspiration path for aspirating the excess ink from said ink permeable portion limited area, and wherein the movement of said suction means is performed in synchronism with said doctor, along a first part of said aspiration path, and with said complementary doctor, along a second part of said aspiration path.

9. The screen printing machine of claim 8, wherein said guiding means are constituted by a guiding track, provided at said frame for guiding the movement of said framework structure over said mesh surface, and by the perimetric edge of said sheet material, said suction means moving along said aspiration path by being guided along the perimetric edge of said sheet material.

10. The screen printing machine of claim 9, wherein said framework structure comprises a first and a second framework, said first and second frameworks being each actuatable to move independently from each other along said track.

11. The screen printing machine of claim 10, wherein said first framework is constituted by a first bridge for supporting said doctor and by a second bridge for supporting said complementary doctor, said second bridge being parallel to the first bridge.

12. The screen printing machine of claim 10, wherein said second framework has a bridge-like configuration and comprises a slider which is slidingly movable thereon, said suction means being supported on said slider for horizontal movement along said two perpendicular axes and for further movement along a third vertical axis, between a lifted position, away from said mesh surface, and a lowered position, in contact with said mesh surface.

13. The screen printing machine of claim 8, wherein said suction unit comprises an aspirator, a collection tank, and a flexible hose for connecting said suction unit to said aspirator, and wherein said suction means is constituted by a suction nozzle connected to said collection tank.

* * * * *